United States Patent
Satoh et al.

(10) Patent No.: US 9,812,499 B1
(45) Date of Patent: Nov. 7, 2017

(54) MEMORY DEVICE INCORPORATING SELECTOR ELEMENT WITH MULTIPLE THRESHOLDS

(71) Applicant: Avalanche Technology, Inc., Fremont, CA (US)

(72) Inventors: Kimihiro Satoh, Fremont, CA (US); Hongxin Yang, Newark, CA (US)

(73) Assignee: Avalanche Technology, Inc., Fremont, CA (US)

(*) Notice: Subject to any disclaimer, the term of this patent is extended or adjusted under 35 U.S.C. 154(b) by 0 days.

(21) Appl. No.: 15/221,505

(22) Filed: Jul. 27, 2016

(51) Int. Cl.
    *H01L 45/00*     (2006.01)
    *H01L 27/24*     (2006.01)

(52) U.S. Cl.
    CPC .................... *H01L 27/24* (2013.01)

(58) Field of Classification Search
    CPC ......... H01L 27/24; H01L 45/00; H01L 45/12; H01L 45/1608; H01L 27/2427
    USPC ...................... 257/4, 2, 5; 438/382
    See application file for complete search history.

(56) References Cited

U.S. PATENT DOCUMENTS

| | | | |
|---|---|---|---|
| 7,935,952 B2 | 5/2011 | Lee et al. | |
| 8,637,342 B2 | 1/2014 | Karpov et al. | |
| 8,958,234 B2 | 2/2015 | Nodin | |
| 2013/0070511 A1* | 3/2013 | Wells | G11C 8/06 365/148 |
| 2014/0157065 A1* | 6/2014 | Ong | G11C 29/12 714/718 |
| 2014/0209892 A1 | 7/2014 | Kuo et al. | |
| 2016/0020250 A1 | 1/2016 | Li et al. | |

\* cited by examiner

*Primary Examiner* — Cuong Q Nguyen
*Assistant Examiner* — Tong-Ho Kim
(74) *Attorney, Agent, or Firm* — Bing K. Yen (57) ABSTRACT

The present invention is directed to a memory device including a memory cell coupled to two wiring lines at two ends thereof. The memory cell includes a memory element, which includes a magnetic free layer and a magnetic reference layer with a tunnel junction layer interposed therebetween, and a bi-directional two-terminal selector element having multiple threshold voltages coupled to the memory element in series. The magnetic free layer has a variable magnetization direction substantially perpendicular to a layer plane thereof and the magnetic reference layer has a fixed magnetization direction substantially perpendicular to a layer plane thereof. In an embodiment, the bi-directional two-terminal selector element includes two selector devices with each selector device including two electrodes with a switching layer interposed therebetween. In another embodiment, the bi-directional two-terminal selector element includes a selector device incorporating therein two switching layers.

15 Claims, 10 Drawing Sheets

MEMORY DEVICE INCORPORATING SELECTOR ELEMENT WITH MULTIPLE THRESHOLDS

BACKGROUND

The present invention relates to a selector element for memory applications, and more particularly, to embodiments of a two-terminal selector element having multiple threshold and holding voltages.

A resistance-based memory device normally comprises an array of memory cells, each of which includes a memory element and a selector element coupled in series between two electrodes. The selector element functions like a switch to direct current or voltage through the selected memory element coupled thereto. The selector element may be a three terminal device, such as transistor, or a two-terminal device, such as diode or Ovonic threshold switch. Upon application of an appropriate voltage or current to the selected memory element, the electrical property of the memory element would change accordingly, thereby switching the stored logic in the respective memory cell.

Figure 1:
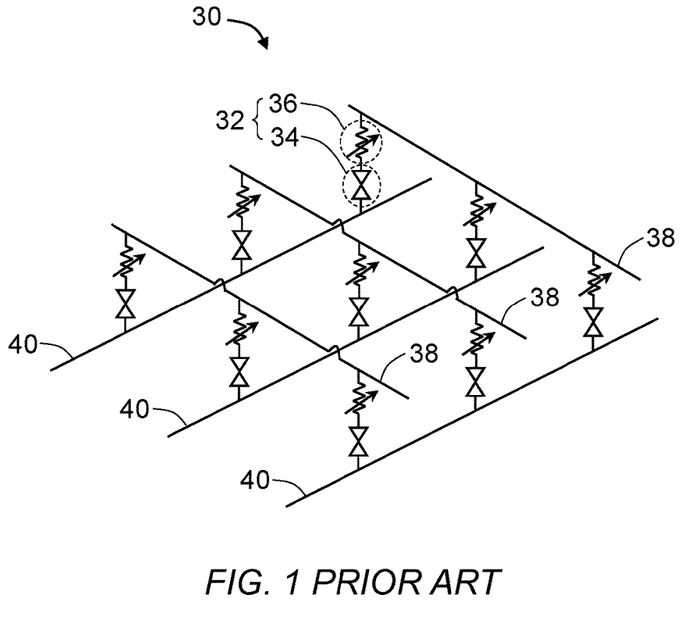
FIG. 1 is a schematic circuit diagram of a memory array including a plurality of memory cells with each comprising a memory element and a two-terminal selector element coupled in series between two wiring lines.

FIG. 1 is a schematic circuit diagram of a memory array 30, which comprises a plurality of memory cells 32 with each of the memory cells 32 including a bi-directional two-terminal selector element 34 coupled to a resistance-based memory element 36 in series; a first plurality of parallel wiring lines 38 with each being coupled to a respective row of the memory elements 36 in a first direction; and a second plurality of parallel wiring lines 40 with each being coupled to a respective row of the selection elements 34 in a second direction substantially perpendicular to the first direction. Accordingly, the memory cells 32 are located at the cross points between the first and second plurality of wiring lines 38 and 40.

The resistance-based memory element 36 may be classified into at least one of several known groups based on its resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths upon application of an appropriate voltage. The memory element of Magnetic Random Access Memory (MRAM) typically comprises at least two layers of ferromagnetic materials with an insulating tunnel junction layer interposed therebetween. When a switching current is applied to the memory element of an MRAM device, one of the ferromagnetic layers will switch its magnetization direction with respect to that of the other magnetic layer, thereby changing the electrical resistance of the element.

A magnetic memory element normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

Figure 2:
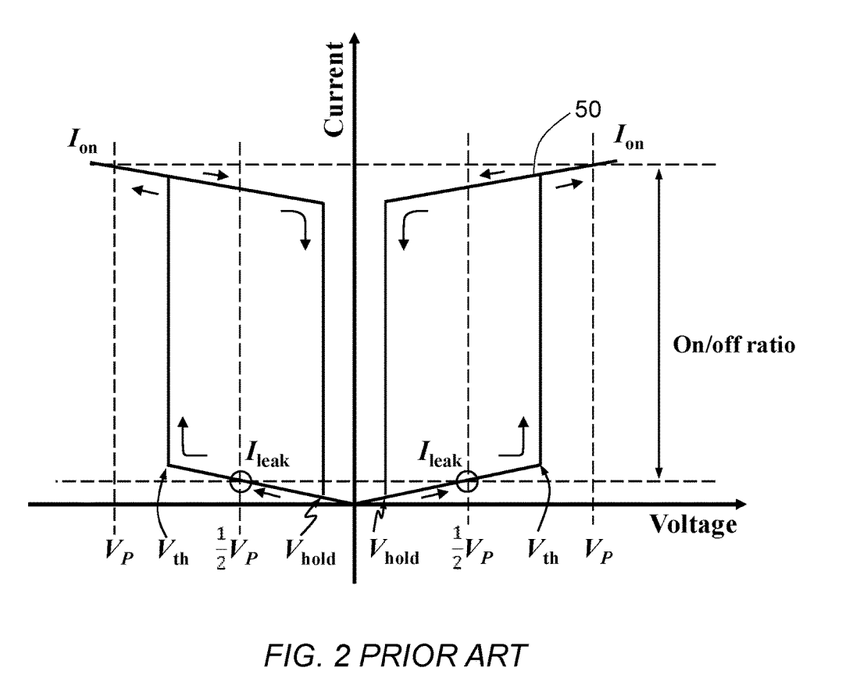
FIG. 2 is an I-V response plot for a bi-directional two-terminal selector device with a single threshold voltage.

FIG. 2 shows an intrisic current-voltage (I-V) response plot for a conventional two-terminal selector device without an external load (e.g., memory element) coupled thereto. The I-V response curve 50 shows the magnitude of electric current passing through the two-terminal selector device as the voltage applied thereto varies. Initially, the current gradually increases with the applied voltage from zero to near a threshold voltage, $V_{th}$. At or near $V_{th}$, the current rapidly increases and exhibits a highly non-linear behavior. As the voltage continues to increase beyond $V_{th}$, the current increase becomes gradual again until reaching $V_p$, which is the programming voltage for the whole memory cell when a memory element is coupled to the selector device. The current response behaves like a step function as the applied voltage increases from zero to $V_p$ with the sharp increase occurring at or near $V_{th}$, which is about 60-80% of $V_p$ in order to minimize current leakage.

Similarly, to read or sense the resistance state of a memory element, the voltage of the selector device needs to be raised to above $V_{th}$ first to turn on the selector device. However, for some types of memory elements, such as MTJ, the high current level associated with $V_{th}$ may cause the unintended switching of the resistance state during a read operation, commonly known as "read disturbance." To prevent the read disturbance of MTJ, the sense current needs to be kept low, preferably about 10% of the programming current.

For the foregoing reasons, there is a need for a bi-directional two-terminal selector element that minimizes the read disturbance of memory elements and that can be inexpensively manufactured.

SUMMARY

The present invention is directed to a memory device that satisfies this need. A memory device having features of the present invention comprises a memory cell coupled to two wiring lines at two ends thereof. The memory cell comprises a memory element including a magnetic free layer and a magnetic reference layer with a tunnel junction layer interposed therebetween; and a bi-directional two-terminal selector element coupled to the memory element in series. The bi-directional two-terminal selector element includes two selector devices having different threshold voltages coupled in series. The magnetic free layer has a variable magnetization direction substantially perpendicular to a layer plane thereof and the magnetic reference layer has a fixed magnetization direction substantially perpendicular to a layer plane thereof. Each of the two selector devices includes two electrode layers with a switching layer interposed therebetween. The switching layers of the two selector devices may have different compositions. Alternatively, the switching layers of the two selector devices may have the same composition but different thicknesses.

According to another aspect of the present invention, a memory device comprises a memory cell coupled to two wiring lines at two ends thereof. The memory cell comprises a memory element including a magnetic free layer and a magnetic reference layer with a tunnel junction layer interposed therebetween; and a bi-directional two-terminal selector element coupled to the memory element in series. The bi-directional two-terminal selector element includes at least two switching layers having different threshold voltages and a plurality of electrodes separated by the at least two switching layers. The magnetic free layer has a variable magnetization direction substantially perpendicular to a layer plane thereof and the magnetic reference layer has a fixed magnetization direction substantially perpendicular to a layer plane thereof. The at least two switching layers may have different compositions. Alternatively, the at least two switching layers may have the same composition but different thicknesses.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a material AB composed of element A and element B, the material AB can be an alloy, a compound, or a combination thereof, except where the context excludes that possibility.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 3:
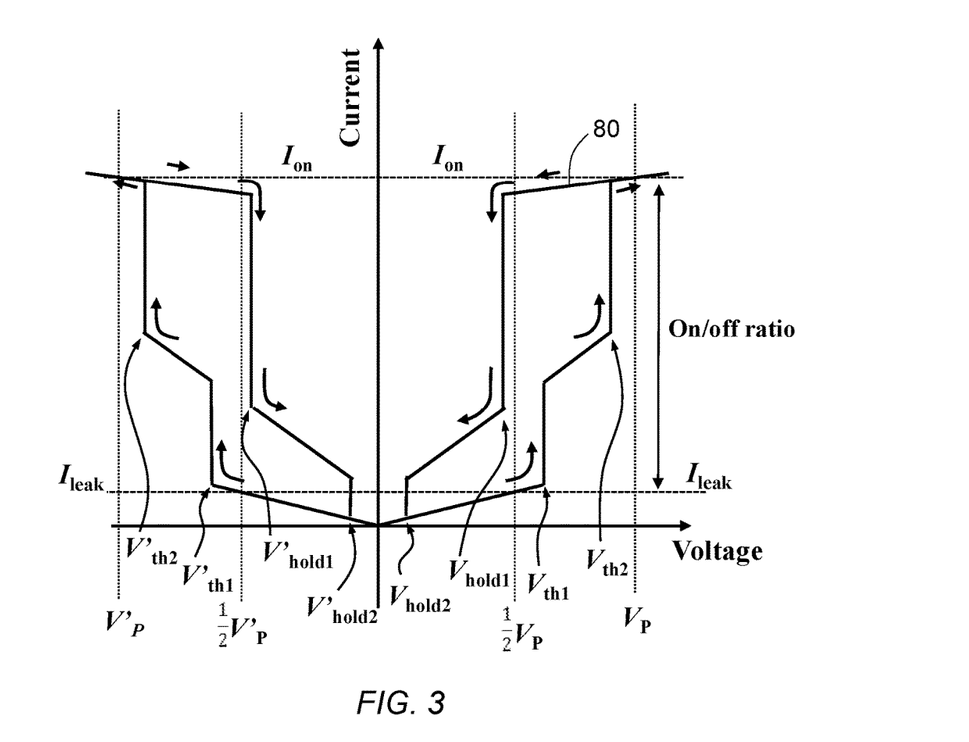
FIG. 3 is an exemplary I-V response plot for a bi-directional two-terminal selector element with two voltage thresholds in accordance with an embodiment of the present invention.

An embodiment of the present invention as applied to a bi-directional two-terminal selector element that minimizes read disturbance will now be described with reference to FIG. 3, which illustrates an I-V response curve 80 for the selector element without an external load coupled thereto. In contrast to the I-V response curve 50 of FIG. 2 for the conventional selector device with a single threshold voltage, the present selector element has two threshold voltages, $V_{th1}$ and $V_{th2}$. The I-V response curve 80 of FIG. 3 shows the magnitude of electric current passing through the two-terminal selector element as the voltage applied thereto varies. Initially, the current gradually increases with the voltage from zero to near a first threshold voltage, $V_{th1}$. At or near $V_{th1}$, the current rapidly increases and exhibits a highly non-linear exponential behavior. As the voltage continues to increase beyond $V_{th1}$, the current increase becomes gradual again until reaching the second threshold voltage, $V_{th2}$, at or near which the current rapidly increases again. As the voltage continues to increase beyond $V_{th2}$, the current increase becomes gradual until finally reaching the programming voltage $V_p$. The current response behaves like a step function as the voltage of the selector element increases from zero to $V_p$ with two sharp increases occurring at or near $V_{th1}$ and $V_{th2}$, each of which may include a narrow range of voltage values.

With continuing reference to FIG. 3, as the voltage of the selector element decreases from $V_p$ to near a first holding voltage, $V_{hold1}$, that is lower than $V_{th2}$, the current gradually decreases and the selector element remains in the highly conductive state. At or near $V_{hold1}$, the current rapidly decreases and exhibits a highly non-linear behavior. As the voltage continues to decrease beyond $V_{hold1}$, the current decrease becomes gradual again until reaching $V_{hold2}$, at or near which the current rapidly decreases again. The current decrease becomes gradual as the voltage decreases from $V_{hold2}$ to zero.

The I-V response curve 80 of the selector element as illustrated in FIG. 3 is characterized by a hysteresis behavior as the voltage of the selector element is increased from zero to $V_p$ and decreased back to zero again. The current response behaves like a step function as the applied voltage increases from zero to $V_p$ with the sharp increases occurring at or near $V_{th1}$ and $V_{th2}$. As the voltage decreases from $V_p$ to zero, the current markedly decreases at or near $V_{hold1}$ and $V_{hold2}$, which are lower than $V_{th2}$ and $V_{th1}$, respectively. The two-terminal selector element is bi-directional as the polarity of the voltage may be reversed from zero to $V'_p$ as illustrated in the I-V plot of FIG. 3. The I-V response corresponding to the opposite polarity is substantially similar to that described above. Although FIG. 3 shows the I-V response curve 80 being substantially symmetric with respect to the current (vertical) axis, the present invention may be practiced even if the I-V response curve of the selector element is asymmetric (i.e. $|V_{th1}| \neq |V'_{th1}|$ and/or $|V_{th2}|$).

Figure 4A:
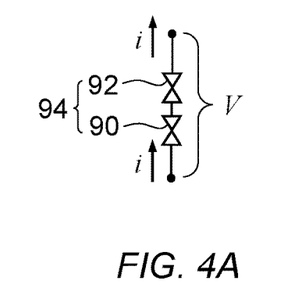
FIG. 4A is a schematic circuit diagram of a selector element that includes two selector devices coupled in series in accordance with an embodiment of the present invention.
Figure 4B:
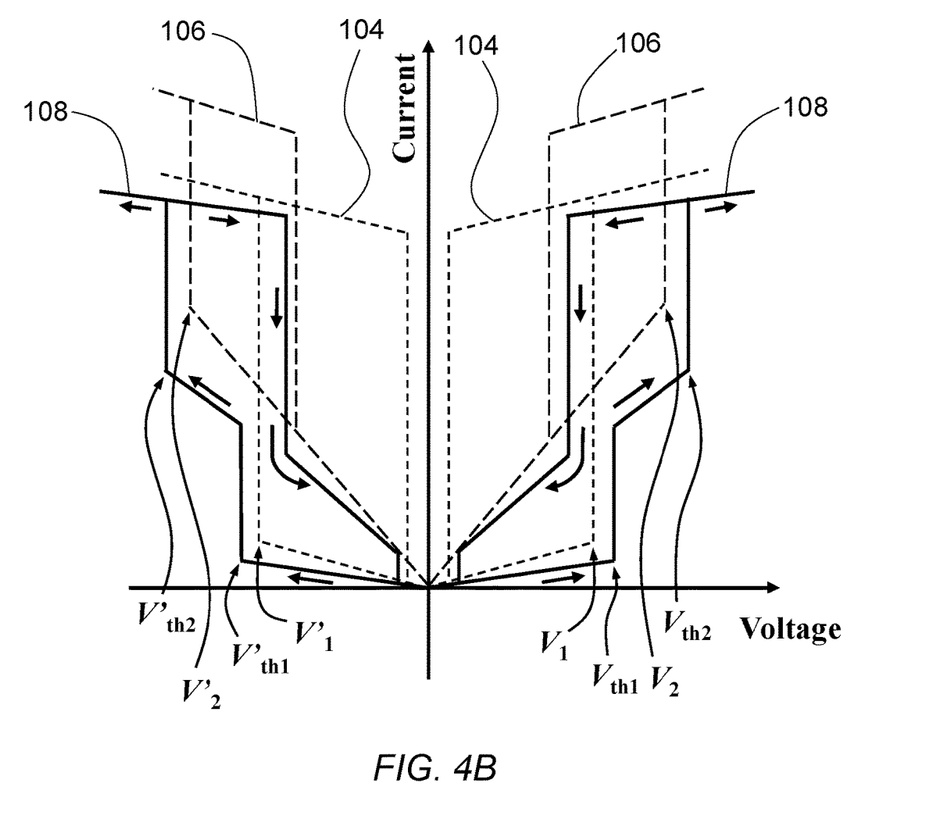
FIG. 4B shows individual I-V response curves for the two selector devices of FIG. 4A with different voltage thresholds and resultant I-V response curve for the two selector devices coupled in series.

A selector element having the I-V response characteristic of FIG. 3 may be constructed by coupling a first selector device 90 and a second selector device 92 together in series to collectively form a selector element 94 as illustrated in FIG. 4A. FIG. 4B shows exemplary I-V response curves 104 and 106 for the first and second selector devices 90 and 92, respectively. The I-V response curve 104 for the first selector device 90 shows a low conduction regime below a threshold voltage of $V_1$ and a high conduction regime above its threshold voltage of $V_1$. The difference between the currents of the low and high conduction regimes may be several orders of magnitude. Similarly, the I-V response curve 106 for the second selector device 106 shows a low conduction regime below a threshold voltage of $V_2$ and a high conduction regime above its threshold voltage of $V_2$. In an embodiment, the first selector device 90 has a lower threshold voltage than the second selector device 92 (i.e. $V_1 < V_2$), and the first selector device 90 has a lower current and hence higher resistance in the low conduction regime than the second selector device 92. Although the exemplary I-V curves 104 and 106 show that the second selector device 92 has a higher current and hence lower resistance in the high conduction regime than the first selector device 90, the first selector device 90 may have a higher current in the high conduction regime than the second selector device 92 in alternative embodiments.

With continuing reference to FIGS. 4A and 4B, the serial coupling of the first and second selector devices 90 and 92, which have the I-V response curves of 104 and 106, respectively, results in the selector element 94 having the I-V response curve 108, which is analogous to the response curve 80 illustrated in FIG. 3. As the selector voltage is increased, the I-V response curve 108 for the selector element 94 is characterized by two threshold voltages of $V_{th1}$ and $V_{th2}$, which mark two abrupt transitions in the selector current. The I-V response curve 108 is mainly governed by the low conduction regime of the first selector device 90 between zero and $V_{th1}$, the low conduction regime of the second selector device 92 between $V_{th1}$ and $V_{th2}$, and the high conduction regime of the first selector device 90 and/or the high conduction regime of the second selector device 92 beyond $V_{th2}$.

Figure 5A:
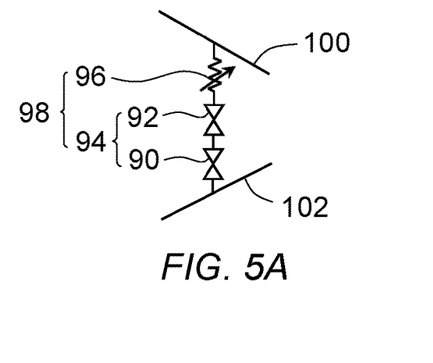
FIG. 5A is a schematic circuit diagram of a memory cell that includes two selector devices and a memory element coupled in series between two wiring lines in accordance with an embodiment of the present invention.

The selector element 94 is may be further coupled to a resistive memory element 96 in series to form a memory cell 98 in between one of a plurality of first wiring lines 100 and one of a plurality of second wiring lines 102 that are substantially perpendicular to the first wiring lines 100 as shown in FIG. 5A. The second selector device 92 is shown to be adjacent to the resistive memory element 94. However, the current invention may also be practiced by reversing the stacking order of the first and second selector devices 90 and 92 such that the first selector device 90 is disposed adjacent to the resistive memory element 94 instead. The memory cell 98 may alternatively be arranged to have the memory element 96 disposed between the first and second selector devices 90 and 92.

Figure 5B:
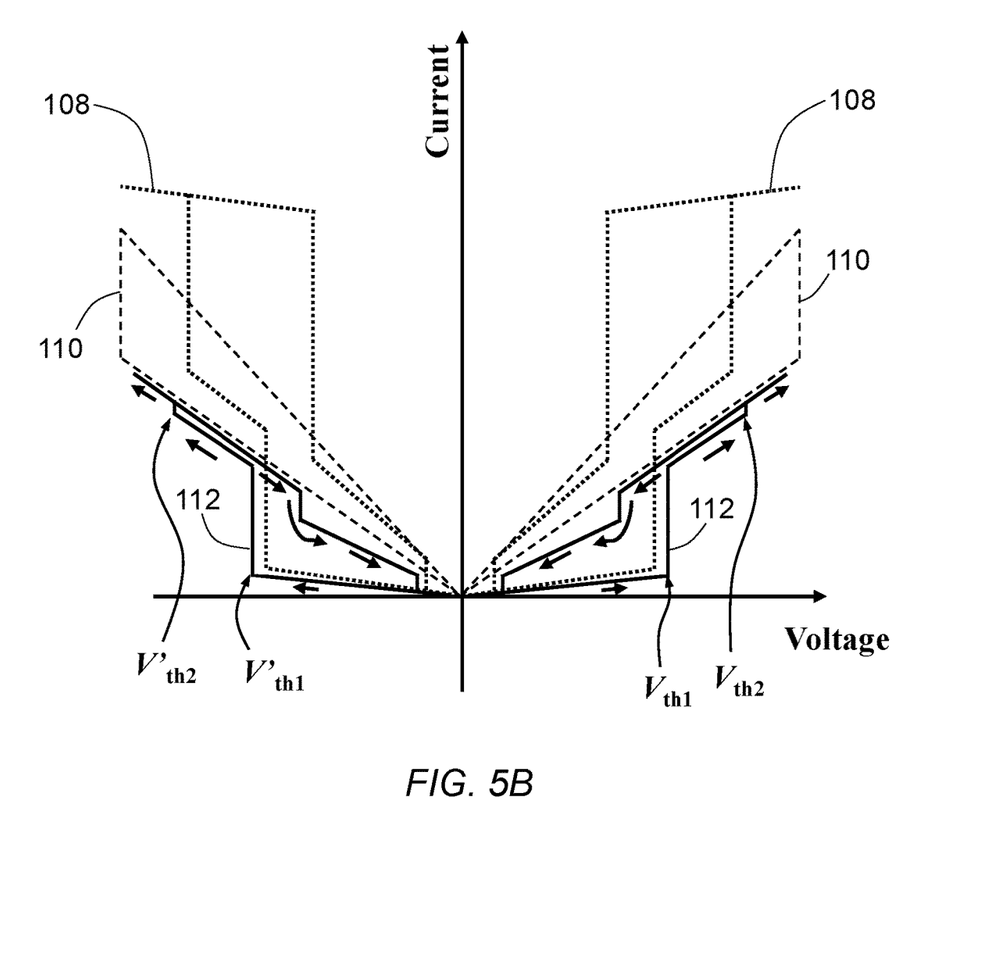
FIG. 5B shows individual I-V response curves for the selector and memory elements, respectively, and an I-V response curve for the memory cell, which includes the selector and memory elements coupled in series, when the memory element is in a high resistance state.
Figure 5C:
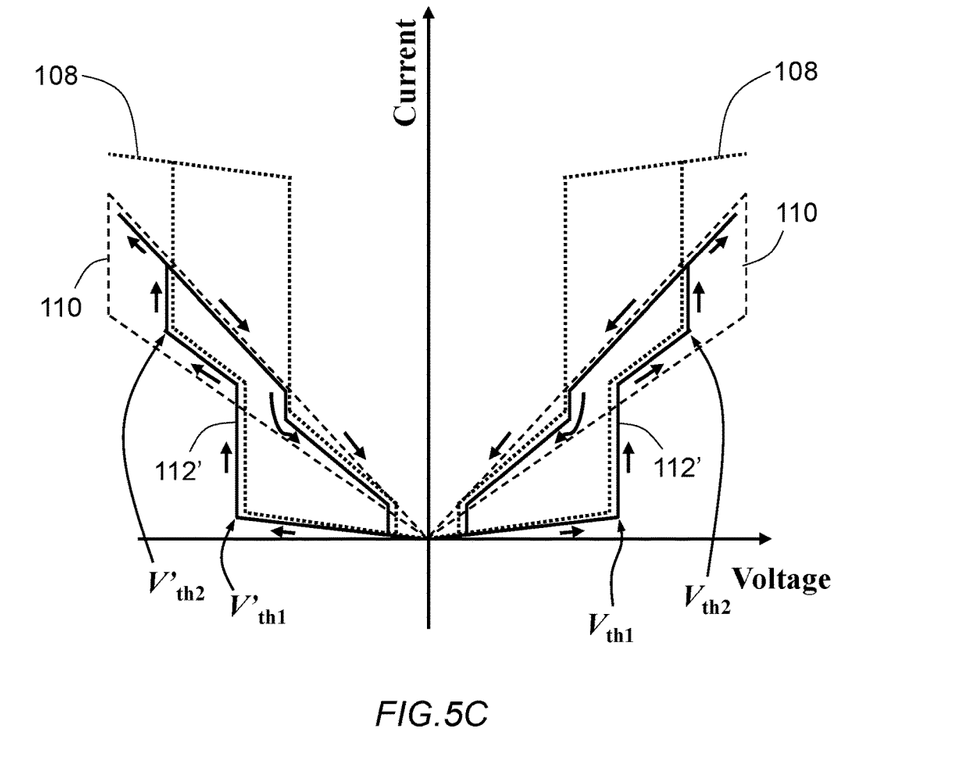
FIG. 5C shows individual I-V response curves for the selector and memory elements, respectively, and an I-V response curve for the memory cell when the memory element is in a low resistance state.

FIG. 5B shows I-V response curves 108 and 110 for the selector element 94 and the memory element 96, respectively, and the resultant I-V response curve 112 of the memory cell 96 when the memory element 96 is in the high resistance state. Similarly, FIG. 5C shows the I-V response curves 108 and 110 for the selector element 94 and the memory element 96, respectively, and the resultant I-V response curve 112' of the memory cell 96 when the memory element 96 is in the low resistance state. Each of the I-V response curves 112 and 112' for the memory cell 98 has two threshold voltages governed by the selector element 94. As the voltage increases from zero up to $V_{th1}$, the I-V response curves 112 and 112' of the memory cell 98 are mostly governed by the selector element 94 owing to its high resistance at the low conduction regime. From $V_{th1}$ to $V_{th2}$, the I-V response curve 112 may be mostly governed by the memory element 96 in the high resistance state, while the I-V response curve 112', which corresponds to the memory element 96 in the low resistance state, may be mostly governed by the selector element 94. Depending on the resistance of the memory element 96, the I-V response curve 112 may alternatively be mostly governed by the selector element 94 between $V_{th1}$ to $V_{th2}$.

In a write operation, the cell voltage may be raised to a programming voltage, $V_p$, beyond $V_{th1}$ and $V_{th2}$, thereby changing the resistance state of the memory element 96. To read or sense the resistance state of the memory element 96, the cell voltage may be raised to a level between $V_{th1}$ and $V_{th2}$, thereby allowing a sensing current, which is designed to be less than the programming current $I_{on}$, to flow through the selector element 94 and the memory element 96 coupled thereto. In an embodiment, the selector element 94 is coupled to an MTJ memory element 96 and the sensing current is limited to about 5-20% of the programming current to avoid read disturbance.

Figure 6A:
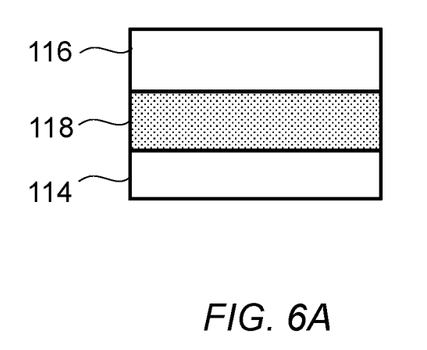
FIGS. 6A and 6B are cross sectional views of a bi-directional two-terminal selector element and a switching layer therein, respectively, in accordance with an embodiment of the present invention.

Each of the first and second selector devices 90 and 92 can be made of any two-terminal selector device known in the art or to be developed in the future. Each of the first and second selector devices 90 and 92 may include a first electrode 114 and a second electrode 116 with a switching layer 118 interposed therebetween as illustrated in FIG. 6A. Each of the first and second electrodes 114 and 116 may be made of any suitable conductor, such as but not limited to Cu, $CuGe_x$, Ni, Ag, Pt, Pd, Cr, Co, Fe, Al, Au, Ir, Ru, Ti, $TiN_x$, Ta, $TaN_x$, W, $WN_x$, Mo, $MoN_x$, Zr, $ZrN_x$, Hf, $HfN_x$, Nb, $NbN_x$, or any combination thereof. In an embodiment, the first and second electrodes 114 and 116 are made of a same material. In an alternative embodiment, the first and second electrodes 114 and 116 are made of different materials.

Figure 6B:
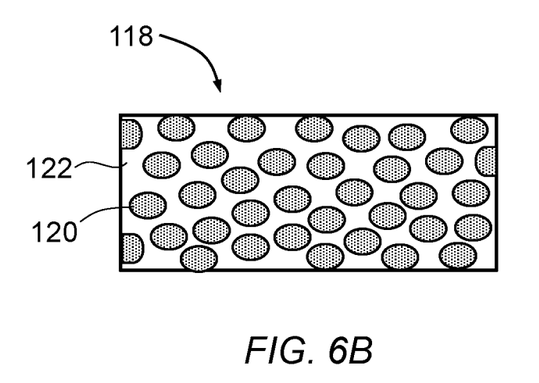

The switching layer 118 may be made of any suitable material that switches its resistance in the presence of an applied field or current, such as but not limited to $CuGe_xS_y$, $CuAg_xGe_yS_z$, $GeSb_xTe_y$, $AgIn_xSb_yTe_z$, $GeTe_x$, $SbTe_x$, $GeSb_x$, $VO_x$, $NiO_x$, $TiO_x$, $CrO_x$, $SrTi_xO_y$, or any combination thereof. The nominally insulating switching layer 118 may further include one or more metallic dopants, such as but not limited to Ag, Au, Zn, and Cu. Alternatively, the switching layer 118 may comprise a plurality of metal-rich clusters 120 embedded in a nominally semi-conducting or insulating matrix 122 as illustrated in FIG. 6B. The matrix 122 of the switching layer 118 may be made of a suitable stoichiometric or near-stoichiometric insulator compound, or a suitable non-stoichiometric insulator compound, or a suitable chalcogenide, or a suitable solid electrolyte, or any combination thereof. Examples of the suitable stoichiometric or near-stoichiometric insulator compound include silicon oxide ($SiO_2$), silicon nitride ($Si_3N_4$), aluminum oxide ($Al_2O_3$), magnesium oxide (MgO), tantalum oxide ($Ta_2O_5$), vanadium oxide ($V_2O_5$), niobium oxide ($Nb_2O_5$), titanium oxide ($TiO_2$), tungsten oxide ($WO_3$), hafnium oxide ($HfO_2$), zirconium oxide ($ZrO_2$), nickel oxides (NiO, $Ni_2O_3$), iron oxide ($Fe_2O_3$), yttrium oxide ($Y_2O_3$), europium oxide ($Eu_2O_3$), and any combinations thereof. Examples of the suitable non-stoichiometric oxide include $SiO_x$, $SiN_x$, $AlO_x$, $MgO_x$, $TaO_x$, $VO_x$, $NbO_x$, $TaO_x$, $TiO_x$, $WO_x$, $HfO_x$, $ZrO_x$, $NiO_x$, $FeO_x$, $YO_x$, $EuO_x$, and any combinations thereof. Examples of the suitable chalcogenide include GeTe, $Sb_2Te_3$, GeSb, $Ge_2Sb_2Te_5$, $GeSbTe_2$, $Sb_3Te_7$, and any combinations thereof. The suitable solid electrolyte for the matrix 122 may comprise one or more of the following elements: Ge, Sb, S, Se, In, Ga, Sn, As, and Te.

With continuing reference to FIG. 6B, the plurality of metal-rich clusters 120 may be made of a noble metal, or an alloy including one or more noble metals, or a fast electric field enhanced diffuser material, or any combination thereof. Examples of the noble metal include gold (Au), silver (Ag), platinum (Pt), palladium (Pd), rhodium (Rh), iridium (Ir), ruthenium (Ru), osmium (Os), and rhenium (Re). Examples of the fast electric field enhanced diffuser material include nickel (Ni), copper (Cu), silver (Ag), gold (Au), zinc (Zn), cobalt (Co), iron (Fe), tungsten (W), molybdenum (Mo), tantalum (Ta), niobium (Nb), aluminum (Al), titanium (Ti), zirconium (Zr), titanium nitride (TiN), zirconium nitride (ZrN), tantalum nitride (TaN), niobium nitride (NbN), and tungsten nitride (WN). In an embodiment, the plurality of metal-rich clusters 120 are made of a same material as at least one of the first and second electrodes 114 and 116.

The threshold voltages of the first and second selector device 90 and 92 may be varied or manipulated by varying the thickness and/or composition of their switching layers. For example, the switching layer of the first selector device 90 may have the same composition as that of the second selector device 92 but is substantially thinner. Alternatively, one of the first and second selector devices 90 and 92 may include a switching layer made of $NbO_x$, $VO_x$, or $TaO_x$, while the other may include a switching layer made of an oxide or chalcogenide incorporating therein Ag, Au, Cu, or other metal dopants.

The memory element 96 may change the resistance state thereof by any suitable switching mechanism, such as but not limited to phase change, precipitate bridging, magnetoresistive switching, or any combination thereof. In one embodiment, the memory element 96 comprises a phase change chalcogenide compound, such as but not limited to $Ge_2Sb_2Te_5$ or AgInSbTe, which can switch between a resistive phase and a conductive phase. In another embodiment, the memory element 96 comprises a nominally insulating metal oxide material, such as but not limited to NiO, $TiO_2$, or $Sr(Zr)TiO_3$, which can switch to a lower electrical resistance state as metal rich precipitates grow and link to form conductive paths upon application of an appropriate voltage. In still another embodiment, the memory element 96 comprises a magnetic free layer and a magnetic reference layer with an insulating electron tunnel junction layer interposed therebetween, collectively forming a magnetic tunnel junction (MTJ). When a switching current is applied, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may have orientations that are parallel to layer planes thereof.

Figure 7:
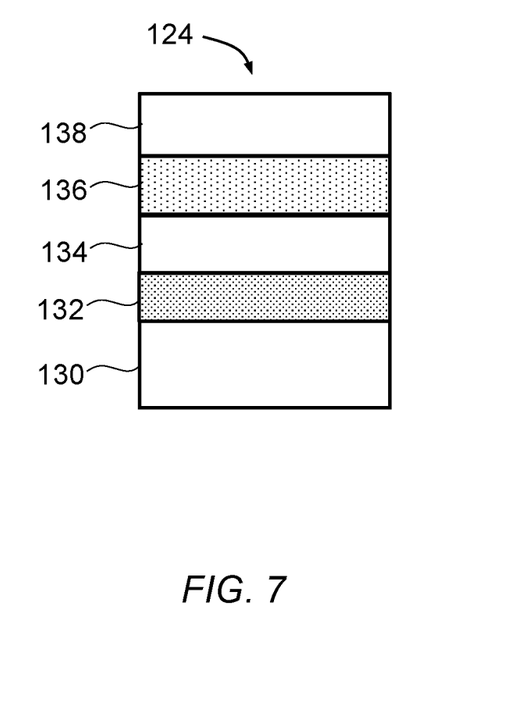
FIG. 7 is a cross sectional view of a bi-directional two-terminal selector element incorporating therein two switching layers in accordance with an embodiment of the present invention.

A selector element having the I-V response characteristic of FIG. 3 may alternatively be constructed by incorporating two switching layers in a selector device as shown in FIG. 7. The selector device 124 includes a first electrode 130, a first switching layer 132, an intermediate electrode 134, a second switching layer 136, and a second electrode 138. The first switching layer 132 is disposed between the first electrode 130 and the intermediate electrode 134, while the second switching layer 136 is disposed between the second electrode 138 and the intermediate electrode 134. The stacking order of the layers 130-138 may be inverted such that the second electrode 138 is on the bottom and the first electrode 130 is on the top of the selector device 124. The first and second switching layers 132 and 136 may be compared to the first and second selector devices 90 and 92, respectively, and may be characterized by the I-V response curves 104 and 106 shown in FIG. 4B. In an embodiment, the first and second switching layers 132 and 136 have threshold voltages of $V_1$ and $V_2$, respectively, with $V_2$ being greater than $V_1$. The selector device 124 with two switching layers 132 and 136 may replace the selector devices 90 and 92 as the selector element 94 in the memory cell 98 shown in FIG. 5A.

Each of the first and second electrodes 130 and 138 may be made of any suitable conductor, such as but not limited to Cu, CuGe$_x$, Ni, Ag, Pt, Pd, Cr, Co, Fe, Al, Au, Ir, Ru, Ti, TiN$_x$, Ta, TaN$_x$, W, WN$_x$, Mo, MoN$_x$, Zr, ZrN$_x$, Hf, HfN$_x$, Nb, NbN$_x$, or any combination thereof. The intermediate electrode 134 may be made of any suitable conductor, such as but not limited to Cu, CuGe$_x$, Ni, Ag, Pt, Pd, Cr, Co, Fe, Al, Au, Ir, Ru, Ti, TiN$_x$, Ta, TaN$_x$, W, WN$_x$, Mo, MoN$_x$, Zr, ZrN$_x$, Hf, HfN$_x$, Nb, NbN$_x$, MoSi$_x$, WSi$_x$, TiSi$_x$, CoSi$_x$, NiSi$_x$, PtSi$_x$, or any combination thereof. In an embodiment, the first and intermediate electrodes 130 and 134 are made of a same material. In another embodiment, the first and intermediate electrodes 130 and 134 are made of different materials. In still another embodiment, the second and intermediate electrodes 138 and 134 are made of a same material. In yet another embodiment, the second and intermediate electrodes 138 and 134 are made of different materials.

Each of the first and second switching layers 132 and 136 may be made of any suitable material as described above for the switching layer 118 and may comprise a plurality of metal-rich clusters 120 embedded in a nominally semi-conducting or insulating matrix 122 as illustrated in FIG. 6B. In an embodiment, the plurality of metal-rich clusters 120 in the first switching layer 132 are made of a same material as at least one of the first and intermediate electrodes 130 and 134. In another embodiment, the plurality of metal-rich clusters 120 in the second switching layer 136 are made of a same material as at least one of the second and intermediate electrodes 138 and 134. The threshold voltages of the first and second switching layers 132 and 136 may be varied or manipulated by varying the thickness and/or composition thereof. For example, the first switching layer 132 may have the same composition as the second switching layer 136 but is substantially thinner. Alternatively, one the first and second switching layers 132 and 136 may be made of NbO$_x$, VO$_x$, or TaO$_x$, while the other switching layer may be made of an oxide or chalcogenide incorporating therein Ag, Au, Cu, or other metal dopants.

Figure 8:
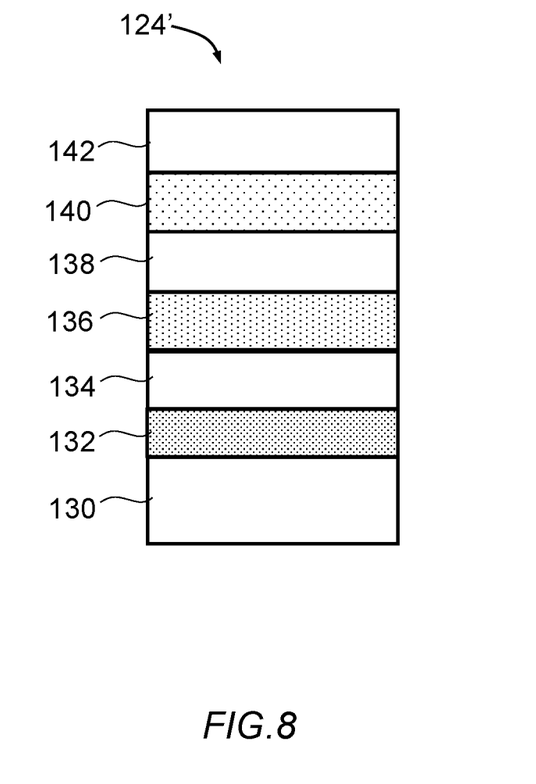
FIG. 8 is a cross sectional view of a bi-directional two-terminal selector element incorporating therein three switching layers in accordance with an embodiment of the present invention.

Another embodiment of the present invention as applied to a two-terminal selector element with multiple thresholds is illustrated in FIG. 8. In the drawing, numerals 130 to 138 denote the same or analogous components as those shown for the embodiment in FIG. 7. The illustrated selector device 124' includes a first electrode 130, a first switching layer 132, a first intermediate electrode 134, a second switching layer 136, a second intermediate electrode 138, a third switching layer 140, and a second electrode 142. Each of the first, second, and third switching layers 132, 136, and 140 is formed between two of the electrodes 130, 134, 138, and 142. The relative stacking order of the first, second, and third switching layers 132, 136, and 140 in the selector device 124' may be changed without affecting the performance thereof. For example, the first switching layer 132 may be disposed above the second switching layer 134 and/or the third switching layer 140. Similarly, the second switching layer 136 may be disposed above the first switching layer 132 and/or the third switching layer 140; and the third switching layer 140 may be disposed above the first switching layer 132 and/or the second switching layer 136. The selector device 124' is different from the selector device 124 of FIG. 7 in that the additional switching layer 140 and electrode 142 are utilized.

Figure 9:
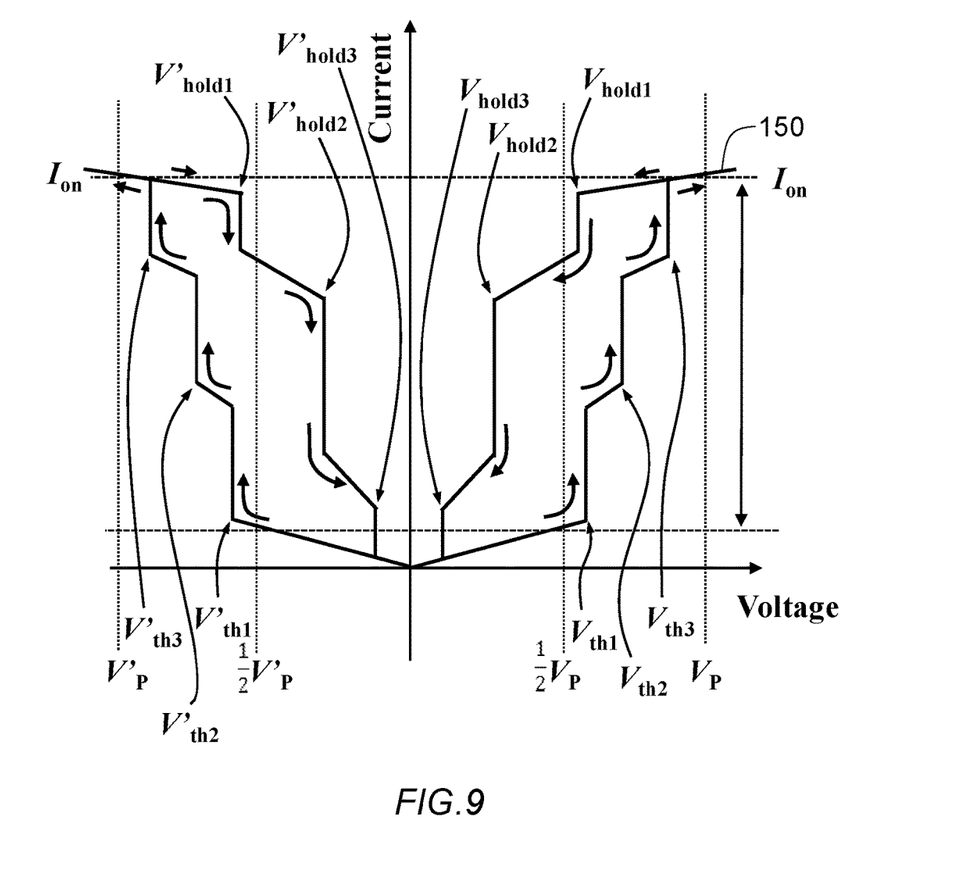
FIG. 9 is an exemplary I-V response plot for a bi-directional two-terminal selector element incorporating therein three switching layers with different threshold voltages.

FIG. 9 illustrates an exemplary I-V response curve 150 corresponding to the selector device 124' shown in FIG. 8 without an external load coupled thereto. The I-V response curve 150 shows the magnitude of electric current passing through the selector device 124' as the voltage across the selector device 124' varies. The I-V response curve 150 has three threshold voltages $V_{th1}$, $V_{th2}$, and $V_{th3}$ governed by the three switching layers 132, 136, and 140 having different threshold voltages. Initially, the current gradually increases with the selector voltage from zero to near a first threshold voltage, $V_{th1}$. At or near $V_{th1}$, the current rapidly increases in a step-like manner and exhibits a highly non-linear behavior. As the voltage continues to increase beyond $V_{th1}$, the current increase becomes gradual again until reaching the second threshold voltage, $V_{th2}$, at or near which the current rapidly increases again. As the voltage continues to increase beyond $V_{th2}$, the current increase becomes gradual until reaching the third threshold voltage, $V_{th3}$, at or near which the current rapidly increases in a step-like manner again. As the voltage continues to increase beyond $V_{th3}$, the current increase becomes gradual until reaching $V_p$. The current response behaves like a step function as the selector voltage increases from zero to $V_p$ with three sharp increases occurring at or near $V_{th1}$, $V_{th2}$, and $V_{th3}$, each of which may include a narrow range of voltage values.

With continuing reference to FIG. 9, as the voltage of the selector device 124' decreases from $V_p$ to near a first holding voltage, $V_{hold1}$, that is lower than $V_{th3}$, the current gradually decreases and the selector device 124' remains in a highly conductive state. At or near $V_{hold1}$, the current rapidly decreases in a step-like manner and exhibits a highly non-linear behavior. As the selector voltage continues to decrease beyond $V_{hold1}$, the current decrease becomes gradual again until reaching $V_{hold2}$, at or near which the current rapidly decreases again. As the voltage continues to decrease beyond $V_{hold2}$, the current decrease becomes gradual until reaching $V_{hold3}$, at or near which the current rapidly decreases in a step-like manner again. The current decrease becomes gradual as the selector voltage decreases from $V_{hold3}$ to zero.

The I-V response curve 150 of the selector device 124' as illustrated in FIG. 9 is characterized by a hysteresis behavior as the voltage of the selector device 124' is increased from zero to $V_p$ and decreased back to zero again. The current response behaves like a step function as the applied voltage increases from zero to $V_p$ with the sharp increases occurring at or near $V_{th1}$, $V_{th2}$, and $V_{th3}$. As the voltage decreases from $V_p$ to zero, the current markedly decreases at or near $V_{hold1}$, $V_{hold2}$, and $V_{hold3}$, which may be lower than $V_{th3}$, $V_{th2}$, and $V_{th1}$, respectively. The two-terminal selector device 124' is bi-directional as the polarity of the voltage may be reversed from zero to $V'_p$ as illustrated in the I-V plot of FIG. 9. The I-V response corresponding to the opposite polarity is substantially similar to that described above.

In an embodiment, the first, second, and third switching layers 132, 136, and 140 have threshold voltages of $V_1$, $V_2$, and $V_3$, respectively, with $V_3$ being greater than $V_2$ and $V_2$ being greater than $V_1$. The selector device 124' with three switching layers 132, 136, and 140 may replace the selector devices 90 and 92 as the selector element 94 in the memory cell 98 shown in FIG. 5A.

Each of the first and second electrodes 130 and 142 may be made of any suitable conductor, such as but not limited to Cu, CuGe$_x$, Ni, Ag, Pt, Pd, Cr, Co, Fe, Al, Au, Ir, Ru, Ti, TiN$_x$, Ta, TaN$_x$, W, WN$_x$, Mo, MoN$_x$, Zr, ZrN$_x$, Hf, HfN$_x$, Nb, NbN$_x$, or any combination thereof. Each of the first and second intermediate electrodes 134 and 138 may be made of any suitable conductor, such as but not limited to Cu, CuGe$_x$, Ni, Ag, Pt, Pd, Cr, Co, Fe, Al, Au, Ir, Ru, Ti, TiN$_x$, Ta, TaN$_x$, W, WN$_x$, Mo, MoN$_x$, Zr, ZrN$_x$, Hf, HfN$_x$, Nb, NbN$_x$, MoSi$_x$, WSi$_x$, TiSi$_x$, CoSi$_x$, NiSi$_x$, PtSi$_x$, or any combination thereof. In an embodiment, the first electrode 130 and the first intermediate electrode 134 are made of a same material. In another embodiment, the first electrode 130 and the first intermediate electrode 134 are made of different materials. In still another embodiment, the first and second intermediate electrodes 134 and 138 are made of a same material. In yet another embodiment, the first and second intermediate electrodes 134 and 138 are made of different materials. In still yet another embodiment, the second intermediate electrode 138 and the second electrode 142 are made of a same material. In yet still another embodiment, the second intermediate electrode 138 and the second electrode 142 are made of different materials.

With continuing reference to FIG. 8, each of the first, second, and third switching layers 132, 136, and 140 may be made of any suitable material as described above for the switching layer 118 and may comprise a plurality of metal-rich clusters 120 embedded in a nominally semi-conducting or insulating matrix 122 as illustrated in FIG. 6B. In an embodiment, the plurality of metal-rich clusters in the first switching layer 132 are made of a same material as at least one of the first electrode 130 and the first intermediate electrodes 134. In another embodiment, the plurality of metal-rich clusters in the second switching layer 136 are made of a same material as at least one of the first and second intermediate electrodes 134 and 138. In still another embodiment, the plurality of metal-rich clusters in the third switching layer 140 are made of a same material as at least one of the second intermediate electrode 138 and the second electrode 142.

The threshold voltages of the first, second, and third switching layers 132, 136, and 140 may be varied or manipulated by varying the thickness and/or composition thereof. For example, the first, second, and third switching layers 132, 136, and 140 may have the same composition but different thicknesses with the first switching layer 132 being thinner than the second switching layer 136 and the second switching layer 136 being thinner than the third switching layer 140. Alternatively, one the first, second, and third switching layers 132, 136, and 140 may be made of NbO$_x$, VO$_x$, or TaO$_x$; another one of the first, second, and third switching layers 132, 136, and 140 may be made of an oxide or chalcogenide incorporating therein Ag, Au, Cu, or other metal dopants; and still another one of the first, second, and third switching layers 132, 136, and 140 may be made of chalcogenide.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

What is claimed is:

1. A memory device comprising a memory cell coupled to two wiring lines at two ends thereof, said memory cell comprising:
    a memory element including a magnetic free layer and a magnetic reference layer with a tunnel junction layer interposed therebetween; and
    a bi-directional two-terminal selector element coupled to said memory element in series, said bi-directional two-terminal selector element including two selector devices having different threshold voltages coupled in series.

2. The memory device of claim 1, wherein said magnetic free layer has a variable magnetization direction substantially perpendicular to a layer plane thereof and said magnetic reference layer has a fixed magnetization direction substantially perpendicular to a layer plane thereof.

3. The memory device of claim 1, wherein each of said two selector devices includes two electrode layers with a switching layer interposed therebetween.

4. The memory device of claim 3, wherein said two electrode layers are made of a same material.

5. The memory device of claim 3, wherein said two electrode layers are made of different materials.

6. The memory device of claim 3, wherein said switching layers of said two selector devices have different compositions.

7. The memory device of claim 3, wherein said switching layers of said two selector devices have a same composition but different thicknesses.

8. The memory device of claim 3, wherein at least one of said switching layers of said two selector devices comprises a chalcogenide or oxide.

9. A memory device comprising a memory cell coupled to two wiring lines at two ends thereof, said memory cell including:
    a memory element including a magnetic free layer and a magnetic reference layer with a tunnel junction layer interposed therebetween; and
    a bi-directional two-terminal selector element coupled to said memory element in series, said bi-directional two-terminal selector element including at least two switching layers having different threshold voltages and a plurality of electrodes separated by said at least two switching layers.

10. The memory device of claim 9, wherein said magnetic free layer has a variable magnetization direction substantially perpendicular to a layer plane thereof and said magnetic reference layer has a fixed magnetization direction substantially perpendicular to a layer plane thereof.

11. The memory device of claim 9, wherein said at least two switching layers have different compositions.

12. The memory device of claim 9, wherein said at least two switching layers have a same composition but different thicknesses.

13. The memory device of claim 9, wherein at least one of said at least two switching layers comprises a chalcogenide or oxide.

14. The memory device of claim 9, wherein said plurality of electrodes have a same composition.

15. The memory device of claim 9, wherein said plurality of electrodes have different compositions.

* * * * *